(12) United States Patent
Lee

(10) Patent No.: US 6,741,447 B2
(45) Date of Patent: May 25, 2004

(54) WAFER SPACE SUPPORTING APPARATUS INSTALLED ON ELECTROSTATIC CHUCK AND METHOD FOR FABRICATING THE SAME

(75) Inventor: Sun-Young Lee, Suwon (KR)

(73) Assignee: Samsung Electronics Co., Ltd., Kyungki-do (KR)

(*) Notice: Subject to any disclaimer, the term of this patent is extended or adjusted under 35 U.S.C. 154(b) by 160 days.

(21) Appl. No.: 10/043,096

(22) Filed: Jan. 14, 2002

(65) Prior Publication Data

US 2002/0181184 A1 Dec. 5, 2002

(30) Foreign Application Priority Data

May 29, 2001 (KR) .......................... 2001-29656

(51) Int. Cl.[7] .................................. H05F 7/00
(52) U.S. Cl. .................... 361/234; 361/230; 361/233; 279/128; 269/8; 269/903
(58) Field of Search ................ 361/234, 230, 361/233; 279/128; 269/8, 903

(56) References Cited

U.S. PATENT DOCUMENTS

| | | | | |
|---|---|---|---|---|
| 5,111,121 A | | 5/1992 | Gries et al. ................. 315/411 |
| 5,825,607 A | * | 10/1998 | Burkhart ..................... 361/234 |
| 6,028,762 A | * | 2/2000 | Kamitani ..................... 361/234 |
| 6,057,513 A | * | 5/2000 | Ushikoshi et al. .......... 174/260 |
| 6,067,222 A | * | 5/2000 | Hausmann .................. 361/234 |

* cited by examiner

Primary Examiner—Dean A. Reichard
Assistant Examiner—Anton Harris
(74) Attorney, Agent, or Firm—Lee & Sterba, P.C.

(57) ABSTRACT

A wafer space supporting apparatus is installed on a support chuck to relieve physical stress caused by thermal expansion or contraction of an object to be fabricated and adjusts itself to support the object to compensate for thermal expansion and contraction as well as minimize hard defects generated. The wafer space supporting apparatus includes a plurality of sliding pockets sunken into the supporting surface of the chuck, and sliding pads respectively floating-coupled in the sliding pockets such that they are spaced apart from the supporting surface so that they may adapt to expansions and contractions of an object to be fabricated, thereby preventing or minimizing any hard defects or physical stress.

11 Claims, 4 Drawing Sheets

WAFER SPACE SUPPORTING APPARATUS INSTALLED ON ELECTROSTATIC CHUCK AND METHOD FOR FABRICATING THE SAME

BACKGROUND OF THE INVENTION

1. Field of the Invention

The present invention relates to a supporting chuck for adsorbing and supporting a flat plate shaped object such as a semiconductor wafer. More particularly, the present invention relates to a wafer space supporting apparatus installed on the supporting chuck and a method for fabricating the same.

2. Description of Background Art

Currently, for semiconductor products to be competitive, they must be of high quality but low price. High integration is essentially required to achieve low-cost semiconductor products. Highly integrated semiconductor devices require a scale-down process including steps of making gate oxide layers of transistors thinner and their channels shorter. Accordingly, many different semiconductor fabricating processes and related processing systems have been recently developed to create highly integrated semiconductor devices.

In a deposition step of a semiconductor fabricating processes, a gas or other type of material is applied directly or indirectly to a semiconductor wafer or any other object to be produced. The layer quality resulting from the deposition process is mainly determined by parameters such as atmospheric conditions including temperature and pressure of a processing chamber, catalyst gas and reactant gas. It is well known that these same parameters determine the layer quality resulting from an etching process.

In the deposition processing system or etching processing system, the substrate to be fabricated, such as a wafer, must be statically supported inside a reaction chamber in order to obtain a uniform layer. Therefore, a substrate supporting chuck has been widely used for supporting the substrate in semiconductor processing systems. At high temperatures, such as in a high temperature physical vapor deposition (PVD) apparatus, a ceramic electrostatic chuck is used for retaining an object to be fabricated, i.e. a semiconductor wafer, at a fixed position during a period of processing. Such an electrostatic chuck includes more than one electrode embedded in its body. The chuck is made out of various kinds of ceramic materials. These materials may be typical aluminum nitride, a special type of alumina doped with a metal oxide such as titanium oxide, or other ceramic materials having similar electric resistances, but which differ in their other characteristics. These types of ceramic materials have partial conductivity at high temperatures.

When a chucking voltage is applied to the electrodes, the conductivity of the ceramic material at high temperatures enables a wafer to become adsorbed and stuck to the upper surface of the support chuck by the Johnsen-Rahbek effect. A chuck of this kind has been disclosed in U.S. Pat. No. 5,111,121 to Gries et al.

An inconvenience of using the ceramic electrostatic chuck is that particles, a source of contamination, are generated in the fabricating process. When the electrostatic adsorption generates friction at the lower surface of a wafer, that is, between the back side of the wafer and a surface of the ceramic chuck, particles are produced causing a hard defect.

U.S. Pat. No. 5,825,607 issued Oct. 20, 1998 to Burkhart discloses a method for reducing the amount of contamination particles being adsorbed onto the back side of a wafer.

With reference to FIGS. 1 and 2, a wafer 116 is propped apart from a surface 102 of ceramic electrostatic chuck 104 by a wafer spacing mask 100 which is constructed with insulating regions 113 at a surface 102 of the ceramic electrostatic chuck 104 and spacing masks 112 deposited on the insulating regions 113. Therefore, it becomes difficult for particles to become adsorbed onto the back side of the wafer 116.

In other words, the prior art described above has an advantage in reducing both the amount of contamination particles that are adsorbed onto the back side of the wafer and the leakage current flowing through the wafer supported by the electrostatic chuck. The prior art described above has a disadvantage, however, in that the wafer is supported such that it is fixed, but the wafer expands and contracts according to its temperature, thereby causing friction between the upper part of the spacing mask 112 and the back side of the wafer. Hence, in the aforementioned patent, the friction causes another type of hard defect.

Now, generation of the hard defect will become more apparent in the following detailed description. A wafer to be used for fabricating a number of semiconductor devices at one time goes through thermal stress in the course of deposition and etching processes. The thermal stress appears when the wafer repeatedly expands and contracts while moving from a high temperature process to a low temperature process or vice versa. At this time, a thermal expansion coefficient of the wafer and that of the spacing mask installed on the electrostatic chuck are different. Thus, friction is generated between the back side of the wafer and the upper surface of the electrostatic chuck or the upper part of the supporting spacing mask by repetition of expansion and contraction processes. Such a phenomenon becomes worse in a multi-chamber system in which an in-situ process is consecutively performed with various changes in temperature.

As a result, the friction generated between the chuck holding the wafer and the back side of the wafer by expansion and contraction may cause scratches on the back side of the wafer and particles on the back side of the substrate of the electrostatic chuck. Thus, there may be problems of increasing hard defects in the fabricating processes and reducing the lifetime of the electrostatic chuck. In addition, the deformation of the wafer caused by the thermal stress may cause significant deterioration to the functionality and reliability of a micro semiconductor device.

In other words, there is a problem with the conventional electrostatic chuck for supporting an object to be fabricated in that because the object supporting part is fixed, there is no compensation for thermal expansion and contraction of the object, thereby resulting in friction between the object and the supporting device, and deteriorating the reliability of the processing system.

SUMMARY OF THE INVENTION

It is a feature of an embodiment of the present invention to solve the aforementioned problems and provide a method for minimizing friction generated by thermal expansion and contraction of an object to be fabricated.

It is another feature of an embodiment of the present invention to provide an apparatus that minimizes hard defects incurred during a process in which a supporting chuck fixes an object such as a wafer to be fabricated.

It is another feature of an embodiment of the present invention to provide a wafer space supporting apparatus and a method for fabricating the same that relieves the maximum level of stress caused by thermal expansion or contraction of an object to be fabricated and adjusts itself to supporting the object to compensate for thermal expansion and contraction.

It is still another feature of an embodiment of the present invention to provide an apparatus that can effectively restrict generation of particles that become attached to the back side of a wafer, and a method for fabricating the same.

It is still another feature of an embodiment of the present invention to provide an apparatus that can effectively restrict physical stress applied to the wafer while the wafer is held.

In order to accomplish the aforementioned features in accordance with an embodiment of the present invention, an apparatus is provided for supporting an object to be fabricated, wherein the object is supported spaciously apart from a supporting surface of a chuck comprising:

a plurality of sliding pockets sunken into the supporting surface of the chuck; and a plurality of sliding pads respectively floating-coupled in the sliding pockets such that the sliding pads are spaced apart from the supporting surface in order to provide adaptive support to the object to be fabricated to compensate for the object's expansion and contraction.

Preferably, each sliding pocket includes a magnetic pocket body having an internal space that confines a part of the sliding pad to prevent its escape and a magnetic base cover spaced apart from a lower part of the sliding pad for enabling the sliding pad to be connected to or disconnected from the pocket body in one direction.

At this time, the sliding pad may include a sliding body with parts having a magnetic polarity identical to a magnetic polarity of corresponding parts of the pocket body and base cover to allow the sliding pad to move freely in the internal space of the pocket body with no contact, and a supporting member installed at a part of an upper surface of the sliding body.

In accordance with another feature of an embodiment of the present invention, a method for fabricating the wafer space supporting apparatus comprises:

sinking a plurality of sliding pockets into a supporting surface of a chuck; and forming a plurality of sliding pads respectively floating-coupled in the sliding pockets for supporting an object to be fabricated such that the sliding pads are spaced apart from the supporting surface so that the object to be fabricated may be supported adaptively to compensate for its expansion and contraction.

Advantages of the apparatus of the present invention as described above include prevention of particles being stuck to a back side of the object to be fabricated, such as a wafer, and minimization of physical stress to the object to be fabricated that may cause deformation of the object by the ability of the apparatus to support the object tightly, but adaptively to compensate for expansion and contraction of the object, such as a wafer.

These and other features of the present invention will be readily apparent to those of ordinary skill in the art upon review of the detailed description that follows.

DETAILED DESCRIPTION OF THE PREFERRED EMBODIMENTS

Figure 1:
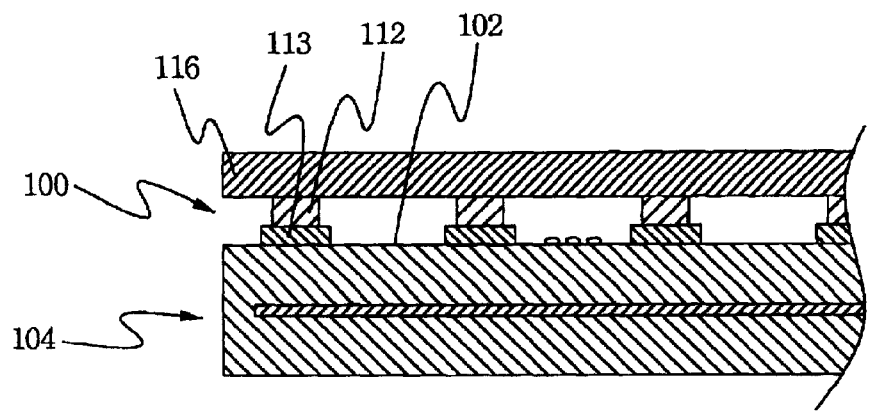
FIGS. 1 and 2 illustrate structural views of a conventional wafer space mask.
Figure 2:
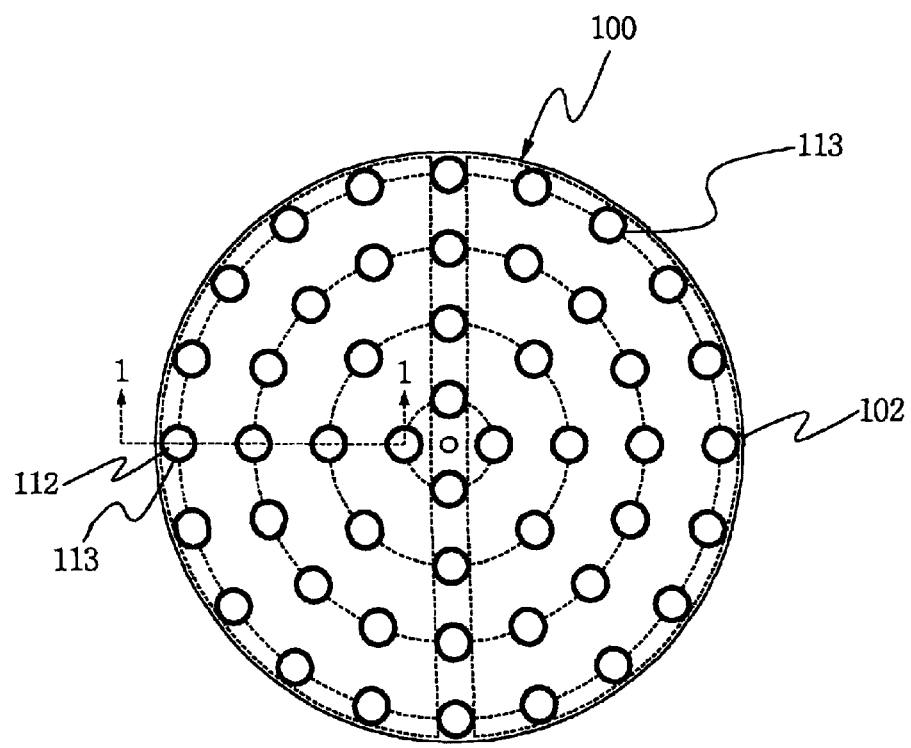

Korean Patent Application No. 2001-29656, filed on May 29, 2002, and entitled: "Wafer Space Supporting Apparatus Installed on Electrostatic Chuck and Method for Fabricating Same," is incorporated by reference herein in its entirety.

Hereinafter, preferred embodiments of the present invention will be described in detail with reference to the accompanying drawings. Like reference numerals refer to like parts throughout.

Figure 3:
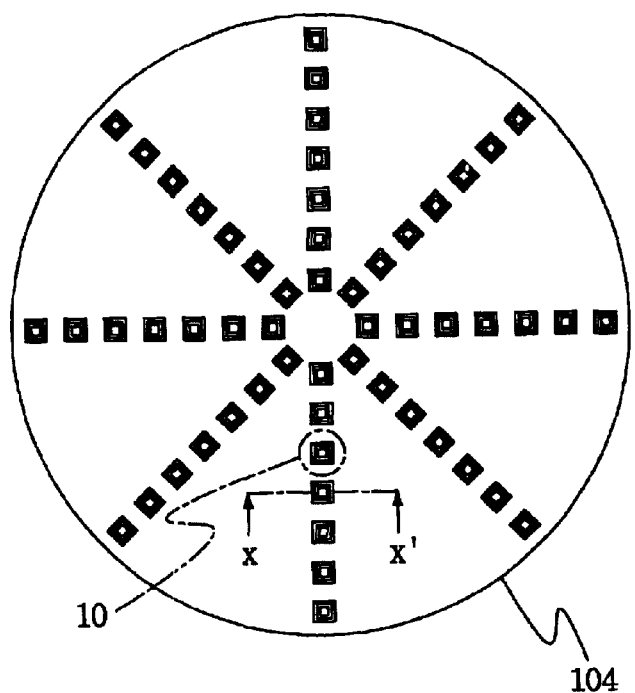
FIG. 3 illustrates a plane view for of the entire wafer space supporting chuck in accordance with an embodiment of the present invention.
Figure 4:
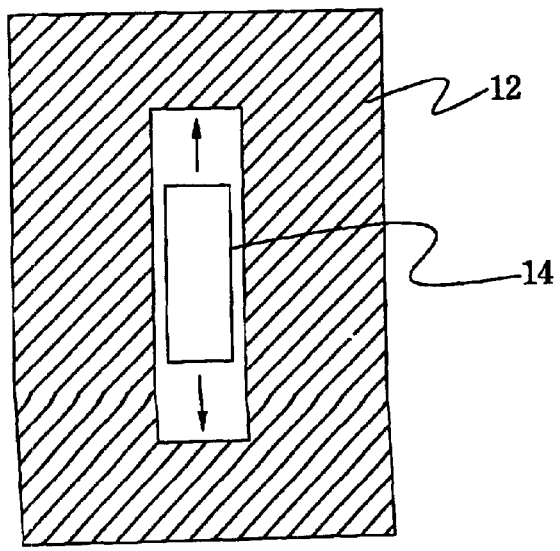
FIGS. 4 and 5 illustrate enlarged plane and cross-sectional views of the wafer space support apparatus shown in FIG. 3.
Figure 5:
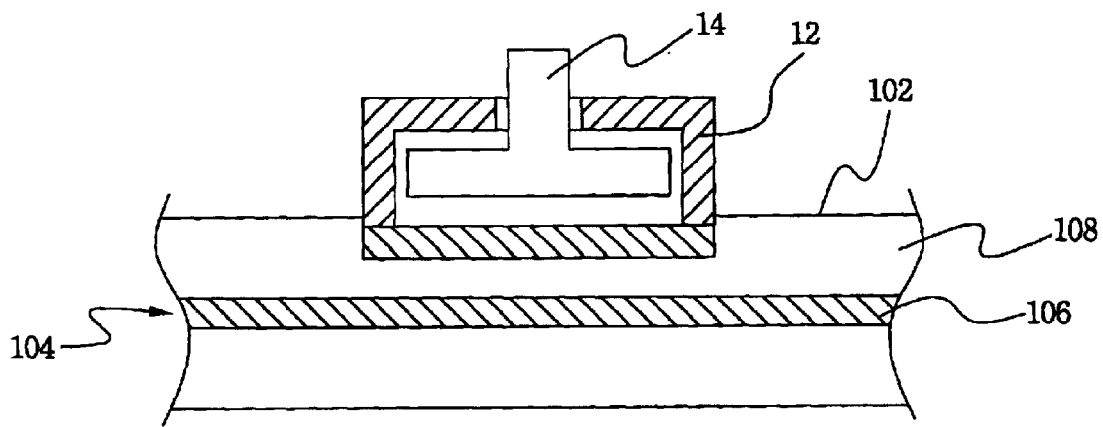

FIG. 3 illustrates a plane view of the entire wafer space supporting chuck in accordance with an embodiment of the present invention, and FIGS. 4 and 5 illustrate, respectively, enlarged plane and cross-sectional views of the wafer space supporting apparatus shown in FIG. 3.

As shown in the drawings, there is a plurality of wafer space supporting apparatuses 10 to support an object to be fabricated spaciously apart from supporting surface 102 of supporting chuck 104. Supporting apparatuses 10 are arranged in a radial shape as shown in the drawing, but they may be arranged in other shapes in different cases. As shown in FIG. 4, illustrating an enlarged plane view of the wafer space supporting apparatuses 10, and in FIG. 5, illustrating a cross-sectional view of the wafer space supporting apparatuses 10 cut along line X–X', wafer space supporting apparatuses 10 include a plurality of sliding pockets 12 sunken into the supporting surface 102 of the chuck 104 and a plurality of sliding pads 14 respectively floating-coupled in the sliding pockets 12 such that the sliding pads are spaced apart from the supporting surface in order to provide adaptive support to the object to be fabricated to compensate for the object's expansion and contraction.

At this time, the sliding pockets 12 and the sliding pads 14 are made of strong magnetic substances like Fe, Ni, Co or Mn or a permalloy, that is, an alloy of Fe and Ni, or alloys of these magnetic substances.

Figure 6:
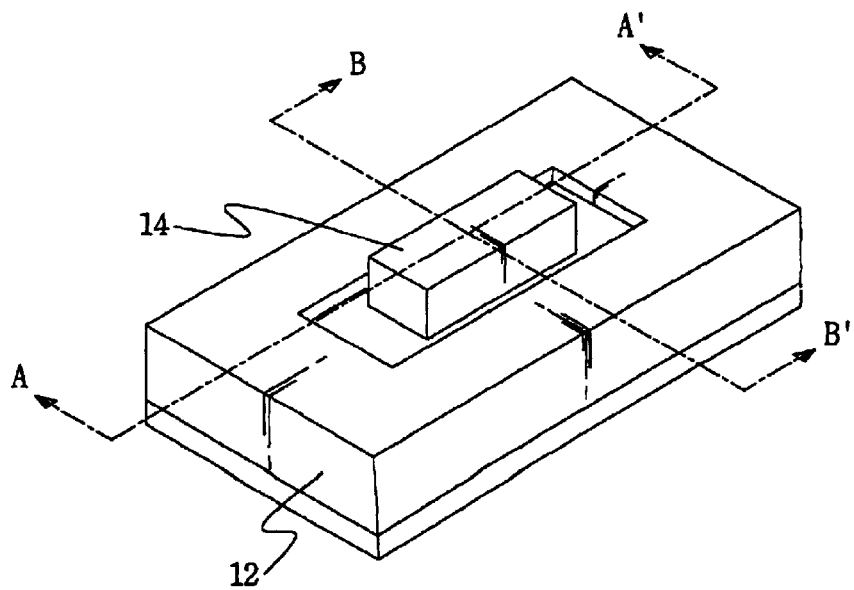
FIG. 6 illustrates a perspective view for of an assembly of the wafer space support apparatus shown in FIG. 3.
Figure 7:
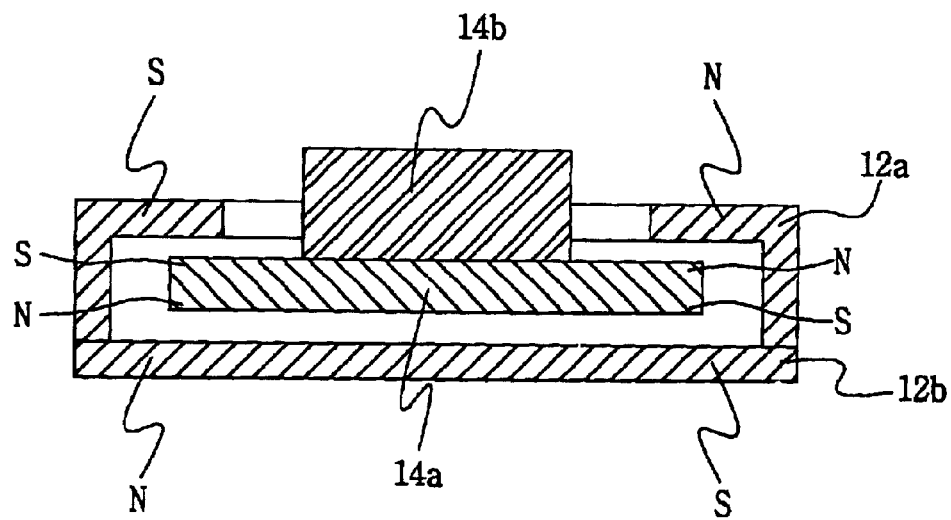
FIGS. 7 and 8 illustrate cross-sectional views respectively cut along lines A–A' and B–B'.
Figure 8:
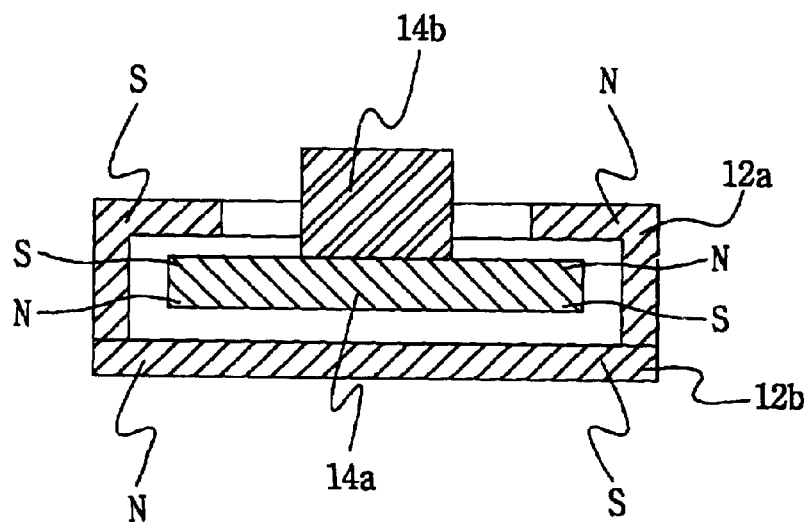

FIG. 6 illustrates a perspective view of assembly of a wafer space supporting apparatus 10 shown in FIG. 3, and FIGS. 7 and 8 illustrate cross-sectional views cut along lines A–A' and B–B' respectively. With reference to the drawings, each sliding pocket 12 includes a magnetic pocket body 12a having an internal space that confines a part of the sliding pad 14 to prevent its escape, and a magnetic base cover 12b spaced apart from a lower part of the sliding pad for enabling the sliding pad 14 to be connected to or disconnected from the pocket body 12a in one direction.

At this time, the sliding pad 14 may include a sliding body 14a with parts having a magnetic polarity identical to the magnetic polarity of corresponding parts of the pocket body 12a and base cover 12b to allow the sliding pad to move freely in the internal space of the pocket body 12a with no contact to the sliding pocket 12, and a supporting member 14b installed at a part of an upper surface of the sliding body.

As shown in FIG. 7, the corresponding parts of the sliding pocket 12 and sliding body 14a are made of a magnetic substance having an identical polarity so that sliding pocket 12 and sliding body 14a repel each other, thereby prohibiting contact. The sliding pad 14 is made in a reverse T shape. As shown in FIGS. 7 and 5, a lower part of the pocket body 12a and the base cover 12b are fixed with a predetermined depth into the supporting surface of the chuck 104 that has an electrode 106 in a ceramic chuck body 108.

At this time, a general electrostatic chuck or another newly made chuck may be used for the body 108 of the electrostatic chuck 104, and a plurality of grooves are formed at an upper part of the body 108 for accommodating the sliding pocket 12. The body 108 is preferably made of a material having a thermal expansion coefficient identical or similar to that of the electrostatic chuck. The base cover 12b of the sliding pocket 12 and the pocket body 12a with a sliding pad 14 being included inside are sequentially pressed and inserted into the grooves. Accordingly, the pocket body 12a and the base cover 12b are integrated to form the sliding pocket 12, and then the sliding pad 14 turns into a combined state as shown in FIG. 6. The supporting member 14b may be made of a non-magnetic insulating material.

Depending on specific uses, the aforementioned wafer space supporting apparatus 10 may be manufactured to be mounted onto a pre-made electrostatic chuck or to be fixed to an electrostatic chuck at the beginning of a manufacturing process. The scope of the present invention covers various wafer supporting apparatuses in any processing system in which a chuck is used, such as a deposition chamber, etching chamber, photo process, diffusion process, chemical and mechanical process or the like.

As described above, an electrostatic chuck is utilized for adsorbing the object to be fabricated through the supporting member with its electrostatic force. A semiconductor wafer is used for manufacturing a plurality of semiconductor devices simultaneously. A description will now be made regarding operation of the wafer space supporting apparatus during the process of fabricating semiconductor devices.

First of all, when a wafer that has been expanded by a high temperature is loaded into a chamber having a low temperature, the temperature of the electrostatic chuck 104 loaded in the chamber having a low temperature is lower than that of the wafer. When a predetermined level of voltage is applied to the electrode 106 of the chuck 104, the back side of the wafer is electro-statically adsorbed to the plurality of supporting members 14b. As time elapses, the wafer cools and contracts. Upon contraction of the wafer, the supporting member 14b moves in a direction of one of the arrows shown in FIG. 4, without any change in the strength of the adsorption force. Now, if the upper part of the drawing of FIG. 4 corresponds to the center direction of the electrostatic chuck 104 as shown in FIG. 3, the supporting member 14b moves in the direction of the arrow in the upper part of the drawing of FIG. 4. In other words, upon contraction of the wafer, the supporting members 14b move in a direction toward the center of the electrostatic chuck 104. At this time, the sliding body 14a is floated with no contact with any part of sliding pocket 12 due to repulsion of the like magnetic polarities of it and the pocket body 12a and base cover 12b. In other words, there is no friction at the lower part of the supporting member 14b. No friction generates at the upper part of the supporting member 14b either because of its movement along the contracting direction of the wafer. As a result, there will be neither contamination particles nor scratches at the back side of the wafer. After completion of the on-going process, the supporting member 14b moves back to its original position. In other words, there is no shrinking force of the wafer after the wafer is unloaded, so that the supporting member 14b automatically returns to its initial position by its magnetic repelling power.

On the other hand, if a wafer having a low temperature is loaded at the chamber having a high temperature, the temperature of the electrostatic chuck 104 is higher than that of the wafer in the chamber having the high temperature. When a predetermined level of voltage is applied to the electrode 106 of the chuck 104, the back side of the wafer is electro-statically adsorbed to a plurality of supporting members 14b. As time elapses, the temperature of the wafer increases and the wafer expands. Then, the supporting member 14b moves in a direction of one of the arrows shown in FIG. 4 without any change in the strength of the adsorption force. If the lower part of the drawing of FIG. 4 corresponds to the peripheral direction of the electrostatic chuck 104 of FIG. 3, then the supporting member 14b moves in the direction of the arrow of the lower part of the drawing of FIG. 4. In other words, upon expansion of the wafer, the supporting members 14b move in a direction toward the periphery of the electrostatic chuck 104. At this time, the sliding body 14a is floated with no contact with any part of sliding pocket 12 due to the repulsion of the like magnetic polarities of it and the pocket body 12a and base cover 12b. In other words, there is no friction at the lower part of the supporting member 14b. No friction generates at the upper part of the supporting member 14b either because of its movement along the expanding direction of the wafer. As a result, there will be neither contamination particles nor scratches at the back side of the wafer.

Finally, the supporting part that is spaced apart from the upper surface of the electrostatic chuck supports the wafer flexibly in relation to its expansion and contraction to prevent or minimize friction.

As described above, there are advantages to the present invention in that it can prevent or minimize particles from being attached to the back side of the wafer and tightly but adaptively support the wafer to compensate for expansion or contraction of the wafer, thereby preventing or minimizing any hard defect or physical stress that may cause deformation of the wafer.

Preferred embodiments of the present invention have been disclosed herein and, although specific terms are employed, they are used in a general and descriptive sense only, and not for the purpose of limitation. Accordingly, it will be understood by those of ordinary skill in the art that various changes in form and details may be made without departing from the spirit and scope of the invention as set forth in the following claims. For instance, the sliding pocket and sliding pad may be modified into a ball shape, or may be made of an electromagnet material instead of permanent magnet for floating without any friction of the lower part.

What is claimed is:

1. An apparatus for supporting an object to be fabricated, wherein the object is supported spaciously apart from a supporting surface of a chuck comprising:

a plurality of sliding pockets sunken into the supporting surface of the chuck; and a plurality of sliding pads respectively floating-coupled in the sliding pockets such that the sliding pads are spaced apart from the supporting surface in order to provide adaptive support to the object to be fabricated to compensate for the object's expansion and contraction.

2. The apparatus for supporting an object to be fabricated of claim 1, wherein each of the sliding pockets includes a magnetic pocket body having an internal space that confines a part of the sliding pad to prevent the sliding pad from escaping, and a magnetic base cover spaced apart from a lower part of the sliding pad for enabling the sliding pad to be connected to or disconnected from the pocket body in one direction.

3. The apparatus for supporting an object to be fabricated of claim 2, wherein the sliding pad includes a sliding body with parts having a magnetic polarity identical to the magnetic polarity of corresponding parts of the pocket body and base cover to allow the sliding pad to move freely in the internal space of the pocket body with no contact to the sliding pocket, and a supporting member installed at a part of an upper surface of the sliding body.

4. The apparatus for supporting an object to be fabricated of claim 3, wherein the corresponding parts of the sliding pocket and sliding body are made of the same magnetic substance.

5. The apparatus for supporting an object to be fabricated of claim 3, wherein the sliding pad is in a reverse T shape.

6. The apparatus for supporting an object to be fabricated of claim 3, wherein the lower part of the pocket body and the base cover are fixed at a predetermined depth into the supporting surface of the chuck.

7. The apparatus for supporting an object to be fabricated of claim 3, wherein the supporting chuck is an electrostatic chuck for adsorbing an object to be fabricated through the supporting member by electrostatic force.

8. The apparatus for supporting an object to be fabricated of claim 3, wherein the object to be fabricated is a semiconductor wafer used for manufacturing a plurality of semiconductor devices simultaneously.

9. A method for fabricating an apparatus for supporting an object to be fabricated, wherein the object is supported spaciously apart from a supporting surface of a chuck comprising:

sinking a plurality of sliding pockets into the supporting surface of the chuck; and forming a plurality of sliding pads respectively floating-coupled in the sliding pockets such that the sliding pads are spaced apart from the supporting surface of the chuck in order to provide adaptive support to the object to be fabricated to compensate for the object's expansion and contraction.

10. The method of claim 9, further comprising:

forming a plurality of accommodation grooves at an upper part of a body of the chuck for accommodating the sliding pocket; and sequentially pressing and inserting into the grooves the base cover of the sliding pocket and the pocket body having the sliding pad floating-coupled inside.

11. The method of claim 10, wherein the body of the chuck is made of a material having a thermal expansion coefficient identical or similar to that of the electrostatic chuck.

* * * * *